(12) United States Patent
Huang et al.

(10) Patent No.: US 11,056,512 B2
(45) Date of Patent: Jul. 6, 2021

(54) DEVICE SUBSTRATE

(71) Applicant: Au Optronics Corporation, Hsinchu (TW)

(72) Inventors: Shin-Wei Huang, Hsinchu (TW); Ching-Kun Lai, Changhua County (TW); Chen-Shun Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 67 days.

(21) Appl. No.: 16/447,999

(22) Filed: Jun. 21, 2019

(65) Prior Publication Data
US 2020/0168632 A1 May 28, 2020

Related U.S. Application Data

(60) Provisional application No. 62/771,264, filed on Nov. 26, 2018.

(30) Foreign Application Priority Data

Dec. 27, 2018 (TW) ................................. 107147481

(51) Int. Cl.
| | | |
|---|---|---|
| *H01L 27/12* | (2006.01) | |
| *H01L 23/498* | (2006.01) | |
| *H01L 21/66* | (2006.01) | |
| *G02F 1/1345* | (2006.01) | |
| *G02F 1/1339* | (2006.01) | |

(52) U.S. Cl.
CPC ........ *H01L 27/124* (2013.01); *G02F 1/13452* (2013.01); *H01L 22/34* (2013.01); *H01L 23/4985* (2013.01); *G02F 1/1339* (2013.01)

(58) Field of Classification Search
CPC . H01L 27/124; H01L 22/34; H01L 23/49858; G01F 1/3452
See application file for complete search history.

(56) References Cited

U.S. PATENT DOCUMENTS

| | | | | |
|---|---|---|---|---|
| 6,128,051 | A | * | 10/2000 | Kim .................. G02F 1/136204 349/40 |
| 8,174,822 | B2 | | 5/2012 | Kim et al. |
| 8,624,243 | B2 | | 1/2014 | Koo et al. |
| 8,816,343 | B2 | | 8/2014 | Koo et al. |
| 2002/0063253 | A1 | * | 5/2002 | Hong ..................... H01L 27/12 257/59 |

(Continued)

FOREIGN PATENT DOCUMENTS

| | | |
|---|---|---|
| CN | 101174373 | 5/2008 |
| CN | 102053437 | 5/2011 |

(Continued)

*Primary Examiner* — Dale E Page
*Assistant Examiner* — Quovaunda Jefferson
(74) *Attorney, Agent, or Firm* — JCIPRNET

(57) ABSTRACT

A device substrate includes a first substrate, an active device array, a data line pad, a gate drive circuit test line, and a first barrier structure. The active device array is located on the first substrate. The data line pad is electrically connected to the active device array. The gate drive circuit test line is located on the first substrate. The first barrier structure is located on the first substrate. The first barrier structure is located between the gate drive circuit test line and the data line pad. The barrier structure includes a first blocking wall.

18 Claims, 12 Drawing Sheets

(56) References Cited

U.S. PATENT DOCUMENTS

| | | |
|---|---|---|
| 2008/0101002 A1 | 5/2008 | Kim et al. |
| 2011/0095290 A1 | 4/2011 | Koo et al. |
| 2013/0277674 A1 | 10/2013 | Koo et al. |
| 2014/0084294 A1 | 3/2014 | Koo et al. |
| 2016/0007478 A1 | 1/2016 | Lai et al. |

FOREIGN PATENT DOCUMENTS

| | | |
|---|---|---|
| CN | 102193236 | 9/2011 |
| CN | 108598039 | 9/2018 |

* cited by examiner

DEVICE SUBSTRATE

CROSS-REFERENCE TO RELATED APPLICATION

This application claims the priority benefit of U.S. provisional application Ser. No. 62/771,264, filed on Nov. 26, 2018, and Taiwan application serial no. 107147481, filed on Dec. 27, 2018. The entirety of each of the above-mentioned patent applications is hereby incorporated by reference herein and made a part of this specification.

BACKGROUND OF THE INVENTION

*Field of the Invention*

The invention is related to a device substrate, and more particularly, to a device substrate for which a barrier structure is located between a gate drive circuit test line and a data line pad.

*Description of Related Art*

In the process of manufacturing a display panel, processes such as etching, exposure, developing, and cutting may generate fine particles of several micrometers or several nanometers, and these fine particles may be attached to the surface of the display panel to cause contamination. Therefore, a detergent is often used to clean the display panel, thereby preventing these fine particles from affecting the display quality of the display panel.

However, when a detergent is used to clean the display panel, the detergent easily penetrates into the portion where the chip is bonded in the peripheral region of the display panel, which easily causes the detergent to corrode the circuit at the chip joint, thus damaging the display device.

SUMMARY OF THE INVENTION

The invention provides a device substrate that may alleviate the issue of corrosion to a circuit in the junction area by a detergent.

An embodiment of the invention provides a device substrate. The device substrate includes a first substrate, an active device array, a data line pad, a gate drive circuit test line, and a first barrier structure. The active device array is located on the first substrate. The data line pad is electrically connected to the active device array. The gate drive circuit test line is located on the first substrate. The first barrier structure is located on the first substrate. The first barrier structure is located between the gate drive circuit test line and the data line pad. The barrier structure includes a first blocking wall.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
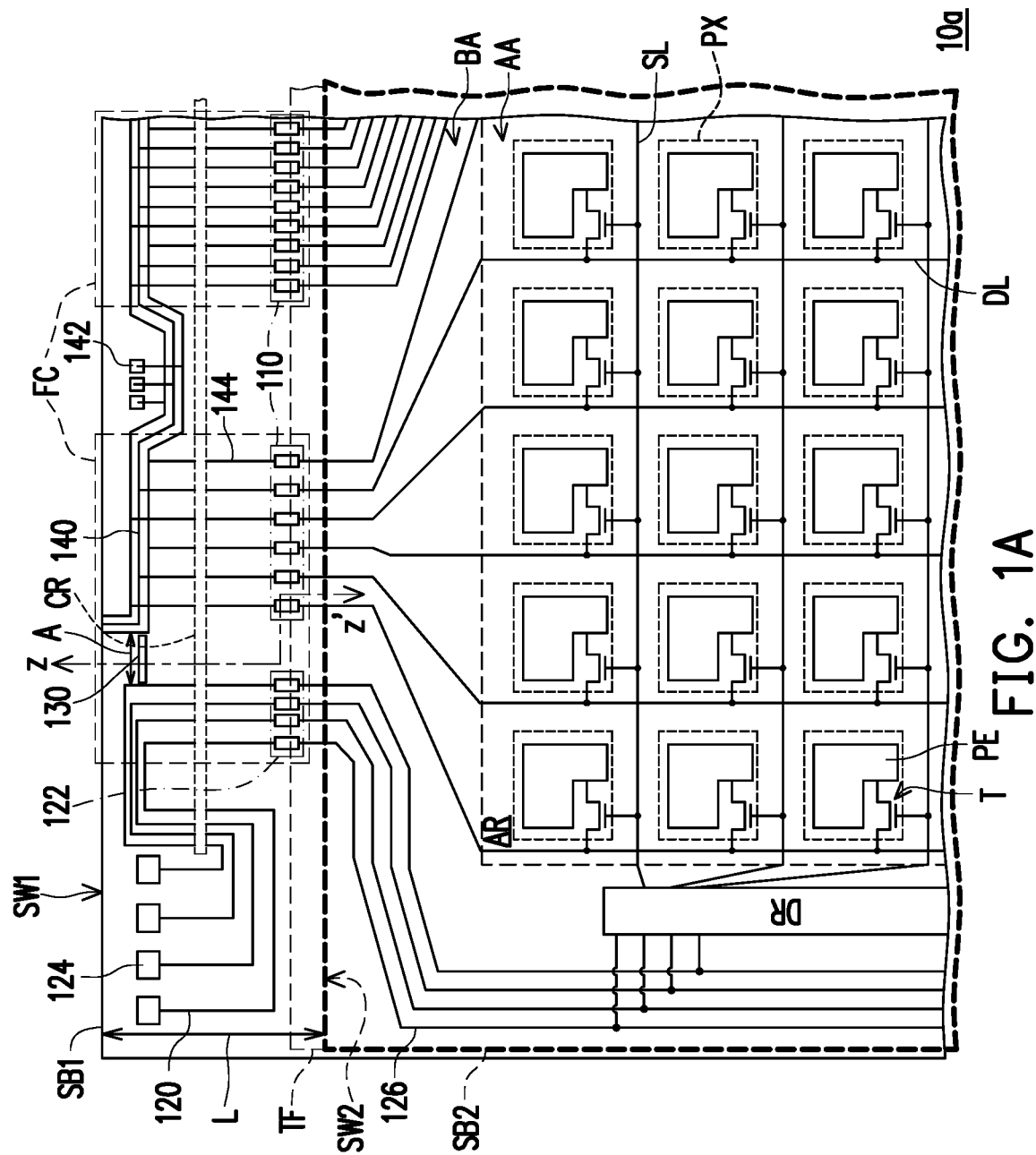
FIG. 1A is a top view of a device substrate according to an embodiment of the invention.
Figure 1B:
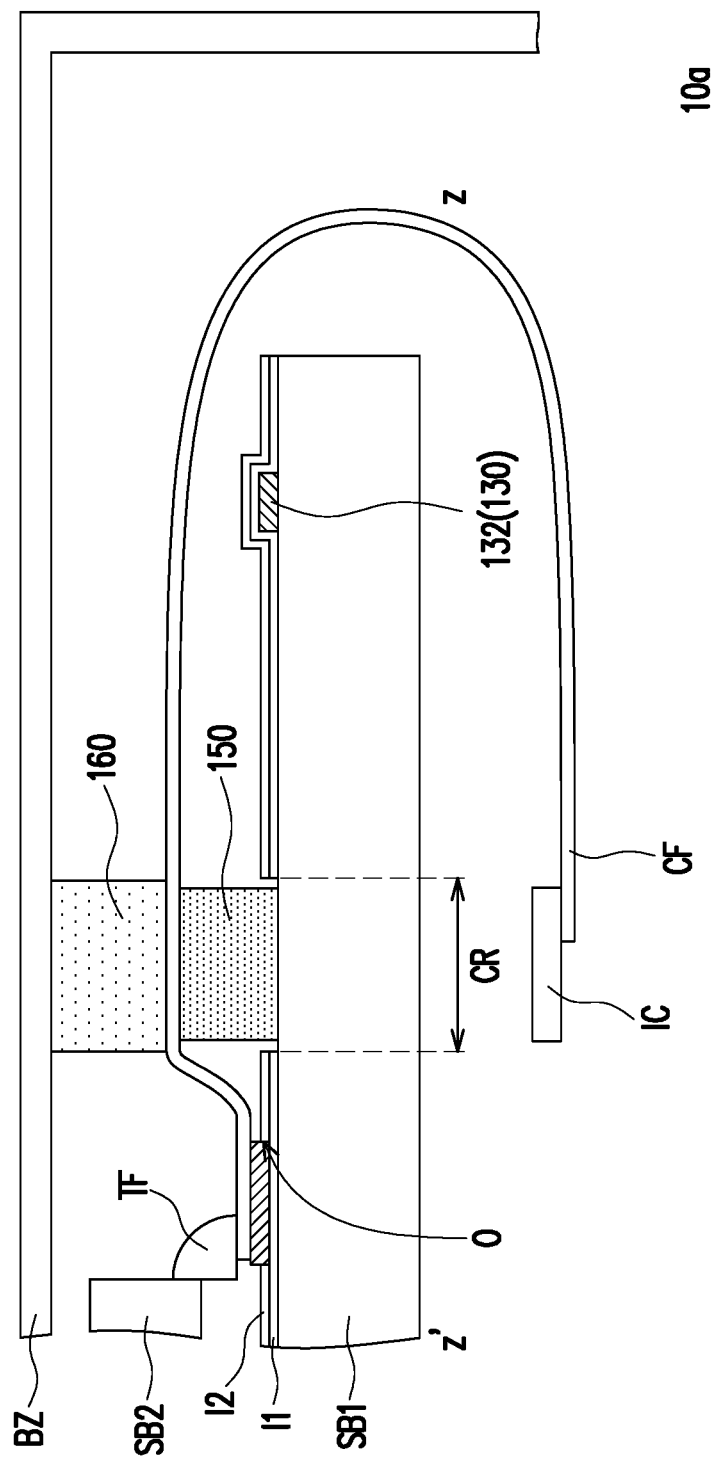
FIG. 1B is a cross section of section line zz' of FIG. 1A.

FIG. 1A is a top view of a device substrate according to an embodiment of the invention. FIG. 1B is a cross section of section line zz' of FIG. 1A. For ease of explanation, FIG. 1A and FIG. 1B omit some components of the device substrate.

Referring to FIG. 1A and FIG. 1B, a device substrate 10a includes a first substrate SB1, an active device array AR, a data line pad 110, a gate drive circuit test line 120, and a first barrier structure 130. In the present embodiment, the device substrate 10a further includes a second substrate SB2, a gate drive circuit pad 122, a test pad 124, a signal line 126, a shorting bar 140, a test pad 142, a signal line 144, a flexible circuit board FC, a protective layer TF, a drive circuit DR, a second barrier structure 150 (not shown in FIG. 1A), a casing BZ (not shown in FIG. 1A), a third barrier structure 160 (not shown in FIG. 1A), and a chip IC. The second substrate SB2 is located on the first substrate SB1. In some embodiments, a color filter device is disposed on the second substrate SB2, and a sealant is also provided between the second substrate SB2 and the first substrate SB1, but the invention is not limited thereto. The second substrate SB2 and the first substrate SB1 are disposed in the casing BZ.

The active device array AR is located on the first substrate SB1, and the active device array AR is located on an active area AA. The active device array AR includes a plurality of pixel units PX, a plurality of scan lines SL, and a plurality of data lines DL. Each of the pixel units PX is electrically connected to at least one of the scan lines SL and at least one of the data lines DL. In the present embodiment, the pixel unit PX includes at least one active device T and at least one electrode PE. The gate and the source of the active device T are electrically connected to the scan lines SL and the data lines DL, respectively, and the drain of the active device T is electrically connected to the electrode PE. In some embodiments, a liquid crystal, an organic light-emitting diode, an inorganic light-emitting diode, or other members may be provided on the electrode PE.

The material of the first substrate SB1 may be glass, quartz, organic polymer, or an opaque/reflective material (for example, a conductive material (for example, metal, alloy, or other suitable materials), wafer, ceramic, or other suitable materials), or other suitable materials. If a conductive material is used, then an insulating layer (not shown) is covered on the first substrate SB1 to avoid a short circuit issue.

The data line pads 110 and the gate drive circuit pads 122 are located on the first substrate. The data line pads 110 are electrically connected to the data lines DL of the active device array AR. The gate drive circuit pads 122 are electrically connected to the drive circuit DR via the signal lines 126. The drive circuit DR is, for example, a gate driver on array (GOA). The drive circuit DR is electrically connected to the scan lines SL of the active device array AR.

The gate drive circuit test lines 120 and the test pads 124 are located on the first substrate SB1, and the gate drive circuit test lines 120 and the test pads 124 are located on a peripheral area BA. The test pad 124 is electrically connected to the corresponding gate drive circuit test line 120.

The shorting bars 140, the test pads 142, and the signal lines 144 are located on the first substrate SB1, and the shorting bars 140, the test pads 142, and the signal lines 144 are located on the peripheral area BA. The shorting bar 140 is electrically connected to the corresponding test pad 142 and the signal line 144. The shorting bars 140, the test pads 142, and the signal lines 144 are located outside the data line pads 110. In addition to the function of detecting the active device array AR, the shorting bars 140 may also be used to block a detergent and prevent the detergent from corroding the data line pad 110.

Before the function of the active device array AR is detected by the test pads 124 and the test pads 142, the test pads 124 are electrically connected to the gate drive circuit pads 122 via the gate drive circuit test lines 120, and the test pads 142 are electrically connected to the data line pads 110 via the shorting bars 140 and the signal lines 144.

The peripheral area BA of the first substrate SB1 has a cutting path CR located between the data line pads 110 and the shorting bars 140. After the function of the active device array AR is tested with the test pads 124 and the test pads 142, the gate drive circuit test lines 120 and the signal lines 144 are cut by laser along the cutting path CR.

In some embodiments, after the laser cutting process is performed along the cutting path CR, the data line pads 110 is covered by the flexible circuit boards FC. The flexible circuit boards FC are electrically connected to the data line pads 110. In the present embodiment, a portion of the flexible circuit boards FC (for example, the flexible circuit board FC closer to the gate drive circuit test line 120) also covers the gate drive circuit pads 122, and a portion of the flexible circuit boards FC is electrically connected to the gate drive circuit pads 122. In the present embodiment, the chips IC are disposed on the flexible circuit boards FC.

The protective layer TF is located on the flexible circuit board FC. The protective layer TF is overlapped with the data line pad 110. In some embodiments, the protective layer TF is, for example, Tuffy or other materials that may be used to protect the flexible circuit board FC. The protective layer TF may prevent the detergent from penetrating between the data line pad 110 and the first substrate SB1 and the second substrate SB2 from the gap between the flexible circuit board FC and the second substrate SB2.

The first barrier structure 130 is located on the first substrate SB1. The first barrier structure 130 is located between the gate drive circuit test lines 120 and the data line pads 110.

In the present embodiment, the vertical distance between the gate drive circuit test lines 120 and the shorting bars 140 is A, and the vertical distance between a first edge SW1 of the first substrate SB1 and a second edge SW2 of the second substrate SB2 is L. In the present embodiment, A/L is greater than or equal to 0.25%. The first barrier structure 130 is located between the gate drive circuit test lines 120 and the shorting bars 140, and the first barrier structure 130 is located between the first edge SW1 of the first substrate SB1 and the second edge SW2 of the second substrate SB2. Therefore, when the display panel 10a is cleaned, the detergent is less likely to penetrate into the cutting path CR of the display panel 10a from the gap between the gate drive circuit test lines 120 and the shorting bars 140, even below the flexible circuit boards FC. Therefore, it is possible to prevent the data line pads 110 and the gate drive circuit pads 122 below the flexible circuit boards FC from being corroded by the detergent.

In the present embodiment, the barrier structure 130 includes a first blocking wall 132. In the present embodiment, the first blocking wall 132 and the data line pads 110 belong to different metal layers, respectively. For example, the first blocking wall 132 belongs to a first metal layer, and the thickness of the first metal layer is, for example, about 0.3 microns to 2 microns. The data line pads 110 belong to a second metal layer, and the thickness of the second metal layer is, for example, about 0.3 microns to 2 microns. The first metal layer and the second metal layer are separated by a first insulating layer I1, and the thickness of the first insulating layer I1 is, for example, about 0.1 microns to 1 micron. For example, the first metal layer is formed on the first substrate SB1, the first insulating layer I1 is formed on the first metal layer and the first substrate SB1, and the second metal layer is formed on the first insulating layer I1 and the first metal layer. A second insulating layer I2 is formed on the second metal layer and the first insulating layer I1, and the thickness of the second insulating layer I2 is, for example, about 0.1 microns to 3 microns. In the present embodiment, the data line pads 110 are located on the first insulating layer I1, and the second insulating layer I2 has openings O exposing the data line pads 110.

In the present embodiment, the first blocking wall 132 and the gate drive circuit test lines 120 belong to the same metal layer (first metal layer).

In the present embodiment, the extending direction of the first blocking wall 132 is parallel to the first edge SW1 of the first substrate SB1, but is not limited thereto.

The second barrier structure 150 is located between the flexible circuit board FC and the first substrate SB1. The second barrier structure 150 may be integrally formed with the flexible circuit board FC or may be two different members. In the present embodiment, the second barrier structure 150 is formed on the flexible circuit board FC, and the width of the second barrier structure 150 is less than or equal to the width of the flexible circuit board FC. When the flexible circuit board FC is connected to the data line pads 110, the second barrier structure 150 on the flexible circuit board FC corresponds to the position of the cutting path CR. In other words, the second barrier structure 150 is disposed in the cutting path CR. In some embodiments, the centerline of the second barrier structure 150 is correspondingly disposed on the centerline of the cutting path CR. The second barrier structure 150 includes a material having a compression ratio such as rubber, foam, or other similar materials. The compression ratio of the second barrier structure 150 is, for example, less than 80%, preferably less than 60%. In the present embodiment, the second barrier structure 150 may prevent contact between the detergent and the data line pads 110 (and the data lines DL), and may prevent the data lines DL from penetrating the flexible circuit board FC.

The casing BZ is located on the flexible circuit boards FC. The third barrier structure 160 is located between the flexible circuit boards FC and the casing BZ. The third barrier structure 160 may be integrally formed with the casing BZ or may be two different members. The third barrier structure 160 may be formed on the casing BZ or on the flexible circuit boards CF. The third barrier structure 160 is overlapped with the second barrier structure 150. The third barrier structure 160 includes a material having a compression ratio such as rubber, foam, or other similar materials. The compression ratio of the third barrier structure 160 is, for example, less than 80%, preferably less than 60%. In the present embodiment, the third barrier structure 160 helps to make the second barrier structure 150 more conformable to the cutting path CR. In some embodiments, the third barrier structure 160 includes a heat dissipating material. In an embodiment in which the third barrier structure 160 includes a heat dissipating material, the third barrier structure 160 may assist the flexible circuit boards FC in transferring thermal energy to the casing BZ.

Based on the above, the first barrier structure 130, the second barrier structure 150, and the third barrier structure 160 of the device substrate 10*a* may alleviate the issue that the circuit in the junction area of the flexible circuit board FC is corroded by a detergent.

Figure 2A:
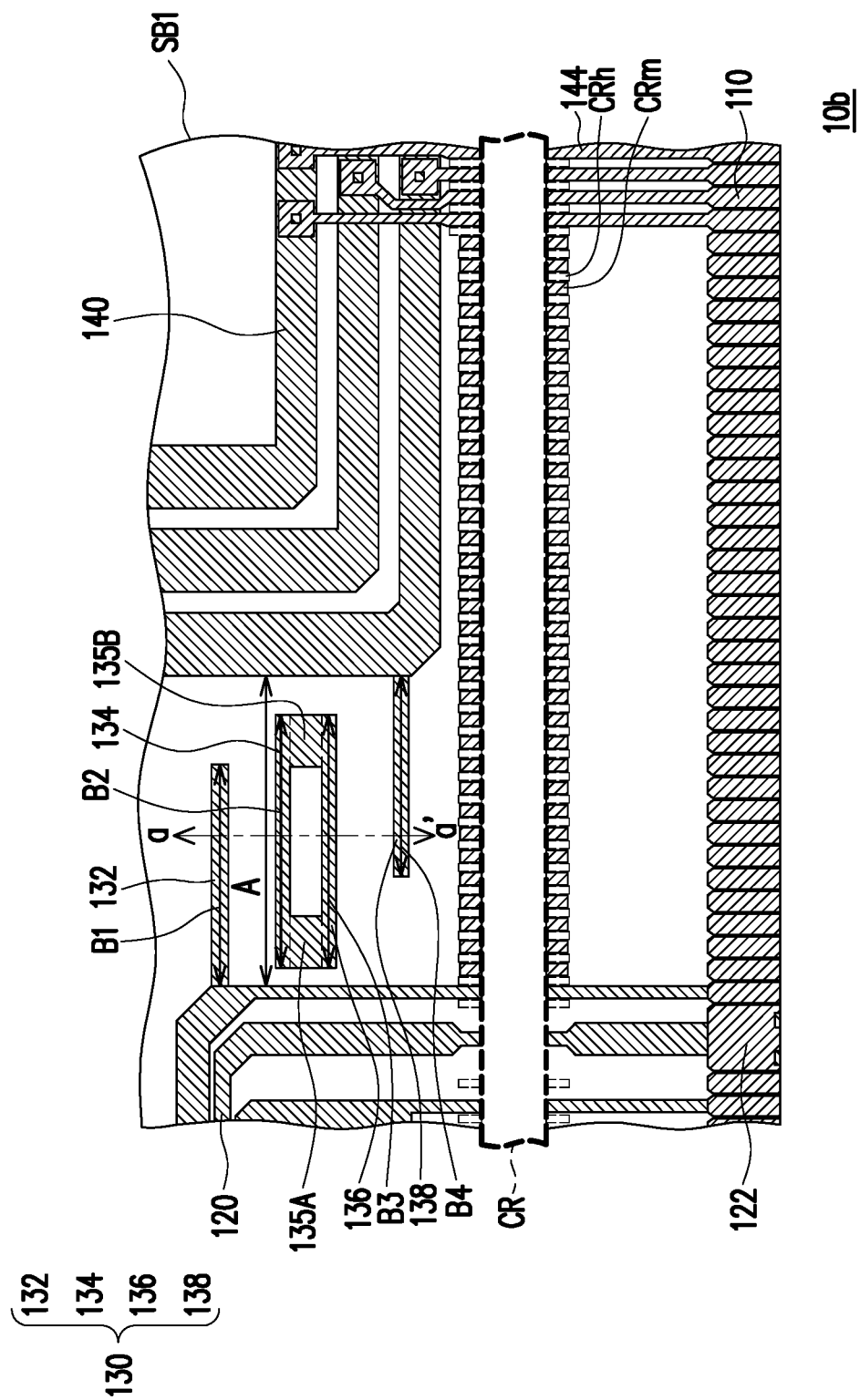
FIG. 2A is a top view of a device substrate according to an embodiment of the invention.
Figure 2B:
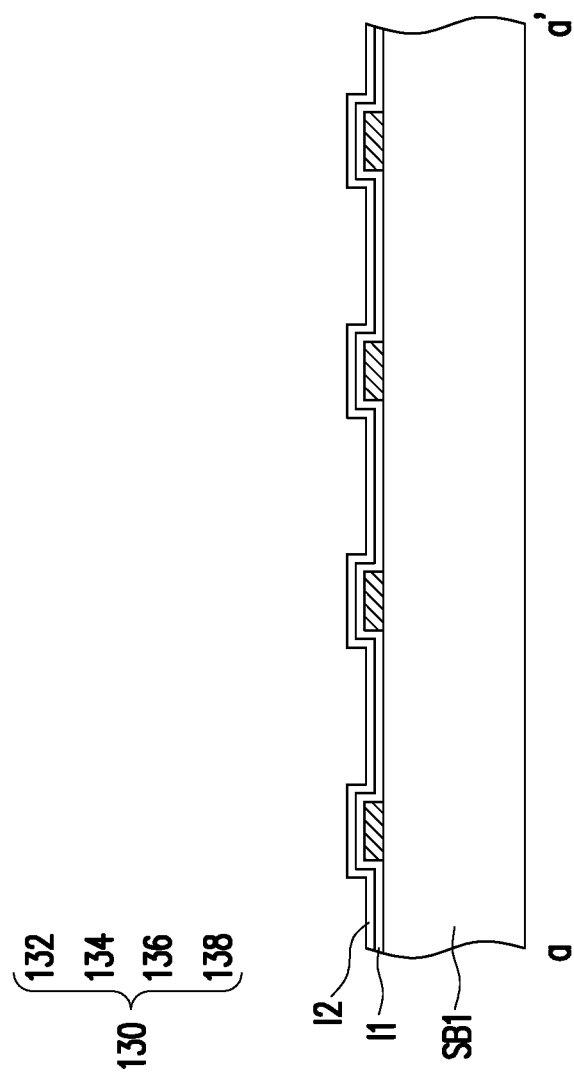
FIG. 2B is a cross section of section line aa' of FIG. 2A.

FIG. 2A is a top view of a device substrate according to an embodiment of the invention. FIG. 2B is a cross section of section line aa' of FIG. 2A. It should be mentioned here that, the embodiment of FIG. 2A and FIG. 2B adopts the reference numerals of the embodiment of FIG. 1A and FIG. 1B and a portion of the content thereof, wherein the same or similar numerals are used to represent the same or similar devices and descriptions of the same technical content are omitted. The omitted portions are as described in the above embodiments and are not repeated herein. For ease of explanation, FIG. 2A and FIG. 2B omit some components of the device substrate.

The main difference between a device substrate 10*b* of FIG. 2A and the device substrate 10*a* of FIG. 1A is that the first barrier structure 130 of the device substrate 10*b* further includes a second blocking wall 134, a third blocking wall 136, and a fourth blocking wall 138. The spacing between two of the first blocking wall 132, the second blocking wall 134, the third blocking wall 136, and the fourth blocking wall 138 adjacent to each other is about 2 microns to 20 microns.

Referring to FIG. 2A and FIG. 2B, the first blocking wall 132, the second blocking wall 134, the third blocking wall 136, and the fourth blocking wall 138 are located on the first substrate SB1 and located between the gate drive circuit test lines 120 and the data line pads 110. In the present embodiment, the first blocking wall 132, the second blocking wall 134, the third blocking wall 136, and the fourth blocking wall 138 are located between the gate drive circuit test lines 120 and the shorting bars 140. In the present embodiment, the extending directions of the first blocking wall 132, the second blocking wall 134, the third blocking wall 136, and the fourth blocking wall 138 are parallel to the first edge of the first substrate SB1, but are not limited thereto. The lengths of the first blocking wall 132, the second blocking wall 134, the third blocking wall 136, and the fourth blocking wall 138 are a length B1, a length B2, a length B3, and a length B4, respectively.

In the present embodiment, the vertical distance between the gate drive circuit test line 120 and the shorting bar 140 is A, and the vertical distance between a first edge of the first substrate SB2 and a second edge of the second substrate SB2 is L.

A total length B of the first blocking structure 130 is the sum of the length of each of the blocking walls. For example, the total length B of the first barrier structure 130 is the sum of the length B1, the length B2, the length B3, and the length B4, that is, B=B1+B2+B3+B4, and 2A<B<10A.

In the present embodiment, the second blocking wall 134, the third blocking wall 136, a connecting structure 135A, and a connecting structure 135B together form a closed structure. In the present embodiment, the second blocking wall 134, the third blocking wall 136, the connecting structure 135A, and the connecting structure 135B are integrally formed, but the invention is not limited thereto.

In the present embodiment, the first blocking wall 132, the second blocking wall 134, the third blocking wall 136, the fourth blocking wall 138, the gate drive circuit test lines 120, and the shorting bars 140 all belong to the first metal layer. The first blocking wall 132 is connected to the gate drive circuit test line 120, and the first blocking wall 132 and the gate drive circuit test line 120 form an L-shaped structure at the junction, so that the blocking effect is better. The fourth blocking wall 138 is connected to the shorting bar 140. The fourth blocking wall 138 and the shorting bar 140 form an L-shaped structure at the junction, which makes the blocking effect better, but the invention is not limited thereto. In other embodiments, the first barrier structure 130 may also be separated from the shorting bars 140 and the gate drive circuit test lines 120.

In the present embodiment, the first blocking wall 132, the second blocking wall 134, the third blocking wall 136, and the fourth blocking wall 138 include a single layer structure, but the invention is not limited thereto. In other embodiments, at least one of the first blocking wall 132, the second blocking wall 134, the third blocking wall 136, and the fourth blocking wall 138 may also be a multilayer structure and is formed by stacking at least two of a portion of the first metal layer, a portion of the second metal layer, a filter material, and a spacer material.

In the present embodiment, an opening mark CRh and a metal mark CRm are optionally provided in the periphery of the cutting path CR. The opening mark CRh and the metal mark CRm may be used to assist in confirming whether the laser process is smoothly performed along the cutting path CR.

Based on the above, the first barrier structure 130 of the device substrate 10*b* may alleviate the issue of corrosion to a circuit in the junction area of the flexible circuit board FC by a detergent.

Figure 3A:
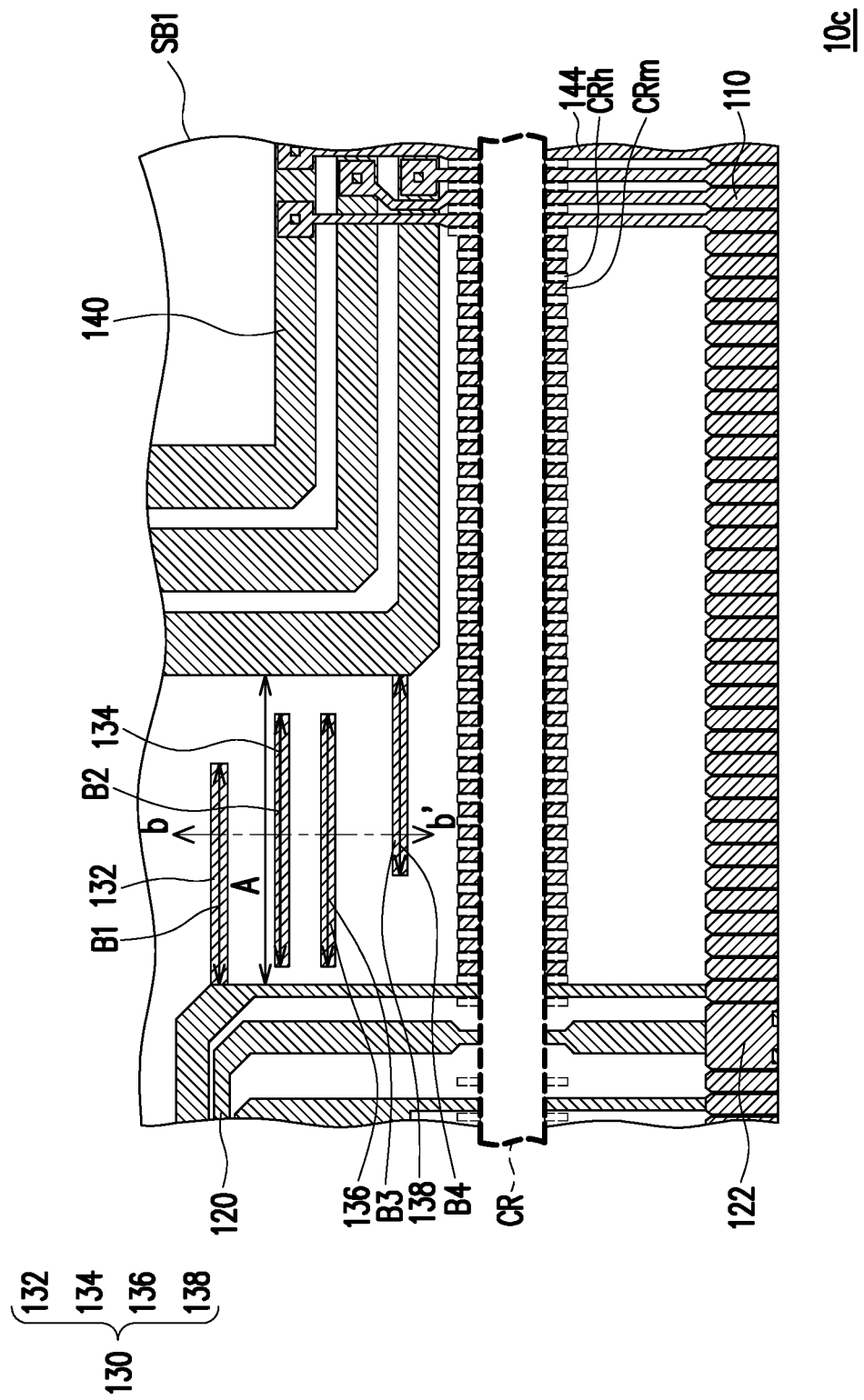
FIG. 3A is a top view of a device substrate according to an embodiment of the invention.
Figure 3B:
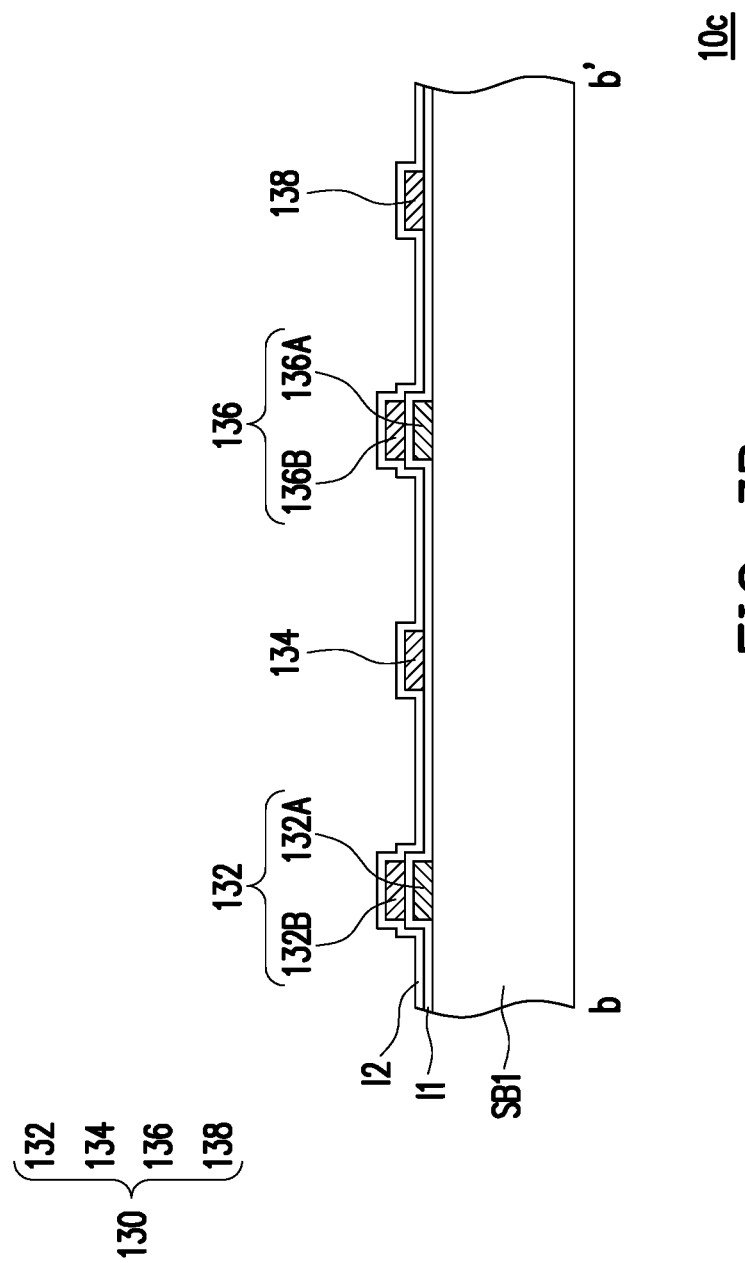
FIG. 3B is a cross section of section line bb' of FIG. 3A.

FIG. 3A is a top view of a device substrate according to an embodiment of the invention. FIG. 3B is a cross section of section line bb' of FIG. 3A. It should be mentioned here that, the embodiment of FIG. 3A and FIG. 3B adopts the reference numerals of the embodiment of FIG. 2A and FIG. 2B and a portion of the content thereof, wherein the same or similar numerals are used to represent the same or similar devices and descriptions of the same technical content are omitted. The omitted portions are as described in the above embodiments and are not repeated herein. For ease of explanation, FIG. 3A and FIG. 3B omit some components of the device substrate.

The main difference between a device substrate 10*c* of FIG. 3A and the device substrate 10*b* of FIG. 2A is that the first blocking wall 132 and the third blocking wall 136 of the first barrier structure 130 of the device substrate 10*c* are multilayer structures.

In the present embodiment, the first blocking wall 132 includes a first layer 132A and a second layer 132B stacked on each other, and the third blocking wall 136 includes a first layer 136A and a second layer 136B stacked on each other. The first layer 132A and the first layer 136A are located between the first insulating layer I1 and the first substrate SB1. The first insulating layer I1 is located between the first layer 132A and the second layer 132B and between the first layer 136A and the second layer 136B.

In the present embodiment, the first layer 132A, the first layer 136A, the gate drive circuit test lines 120, and the shorting bars 140 belong to the first metal layer, and the second blocking wall 134, the fourth blocking wall 138, the second layer 132B, the second layer 136B, and the data line pads 110 belong to the second metal layer.

Based on the above, the first barrier structure 130 of the device substrate 10c may alleviate the issue of corrosion to a circuit in the junction area of the flexible circuit board FC by a detergent.

Figure 4A:
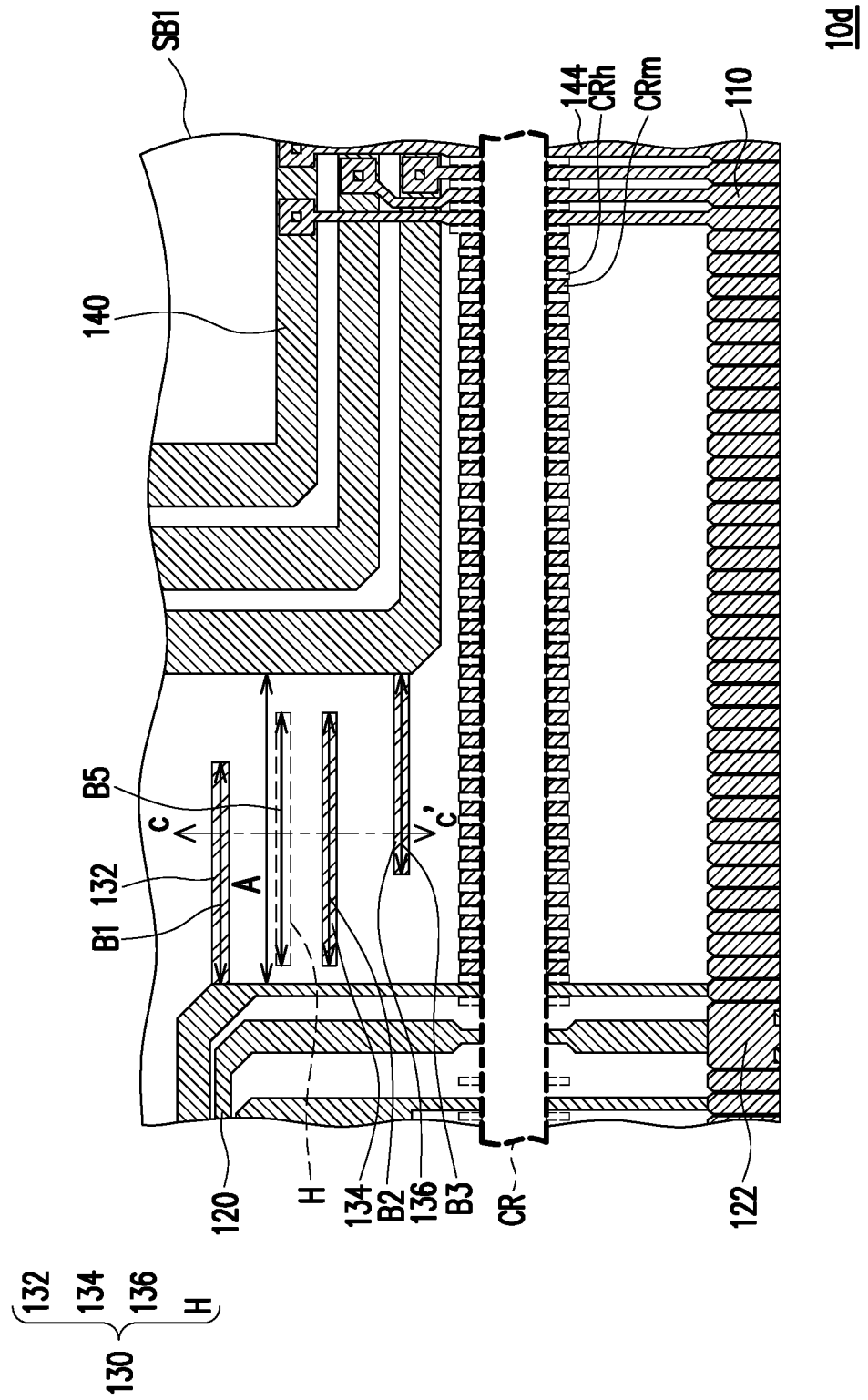
FIG. 4A is a top view of a device substrate according to an embodiment of the invention.
Figure 4B:
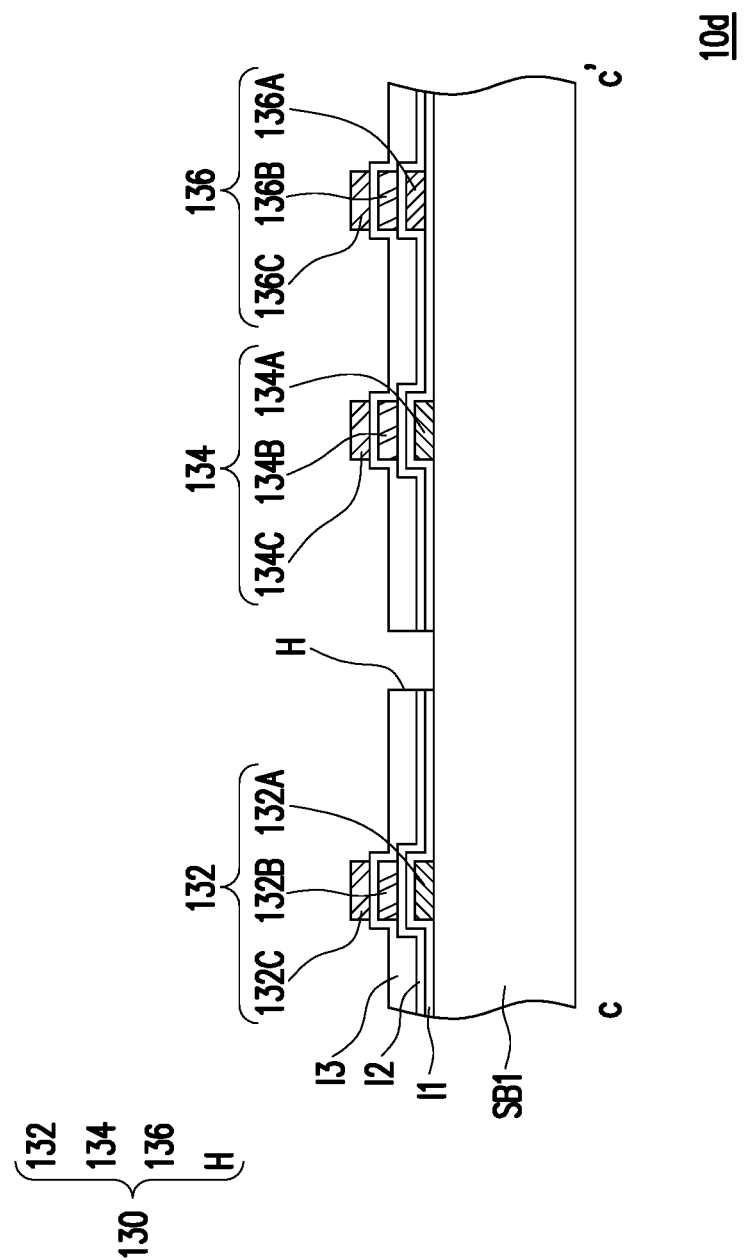
FIG. 4B is a cross section of section line cc' of FIG. 4A.

FIG. 4A is a top view of a device substrate according to an embodiment of the invention. FIG. 4B is a cross section of section line cc' of FIG. 4A. It should be mentioned here that, the embodiment of FIG. 4A and FIG. 4B adopts the reference numerals of the embodiment of FIG. 2A and FIG. 2B and a portion of the content thereof, wherein the same or similar numerals are used to represent the same or similar devices and descriptions of the same technical content are omitted. The omitted portions are as described in the above embodiments and are not repeated herein. For ease of explanation, FIG. 4A and FIG. 4B omit some components of the device substrate.

The main difference between a device substrate 10d of FIG. 4A and the device substrate 10b of FIG. 2A is that the first barrier structure 130 of the device substrate 10d includes the first blocking wall 132, the second blocking wall 134, the third blocking wall 136, and an opening H, wherein the first blocking wall 132, the second blocking wall 134, and the third blocking wall 136 are multilayer structures.

In the present embodiment, the first blocking wall 132 includes the first layer 132A, the second layer 132B, and a third layer 132C stacked on each other, the second blocking wall 134 includes the first layer 134A, the second layer 134B, and a third layer 134C stacked on each other, and the third blocking wall 136 includes the first layer 136A, the second layer 136B, and a third layer 136C stacked on each other.

In the present embodiment, the first layer 132A, the first layer 134A, and the first layer 136A are located between the first insulating layer I1 and the first substrate SB1. The second insulating layer I2 is located between the first insulating layer I1 and the second layer 132B, between the first insulating layer I1 and the second layer 134B, and between the first layer 136A and the second layer 136B. A third insulating layer I3 is located between the second layer 132B and the third layer 132C, between the second layer 134B and the third layer 134C, and between the second layer 136B and the third layer 136C, and the thickness of the third insulating layer I3 is, for example, about 0.1 microns to 3 microns.

In the present embodiment, the first layer 132A, the first layer 134A, the gate drive circuit test lines 120, and the shorting bars 140 belong to the first metal layer. The first layer 136A and the data line pads 110 belong to the second metal layer. The material of the second layer 132B, the second layer 134B, and the second layer 136B includes a filter material. In some embodiments, the thickness of the second layer 132B, the second layer 134B, and the second layer 136B is, for example, 1 micron to 5 microns. The material of the third layer 132C, the third layer 134C, and the third layer 136C includes, for example, a polymer material. In some embodiments, the third layer 132C, the third layer 134C, and the third layer 136C are manufactured, for example, with a spacer between the first substrate and the second substrate for maintaining a gap of the liquid crystal layer.

The first barrier structure 130 includes the opening H penetrating through the first insulating layer I1, the second insulating layer I2, and the third insulating layer I3. The opening H is located between the gate drive circuit test lines 120 and the data line pads 110. In the present embodiment, the opening H is located between the gate drive circuit test lines 120 and the shorting bars 140.

In the present embodiment, the total length B of the first barrier structure 130 is the sum of the length B1 of the first blocking wall 132, the length B2 of the second blocking wall 134, the length B3 of the third blocking wall 136, and a length B5 of the opening H, that is, B=B1+B2+B3+B5, and 2A<B<10A.

Based on the above, the first barrier structure 130 of the device substrate 10d may alleviate the issue of corrosion to a circuit in the junction area of the flexible circuit board FC by a detergent.

Figure 5:
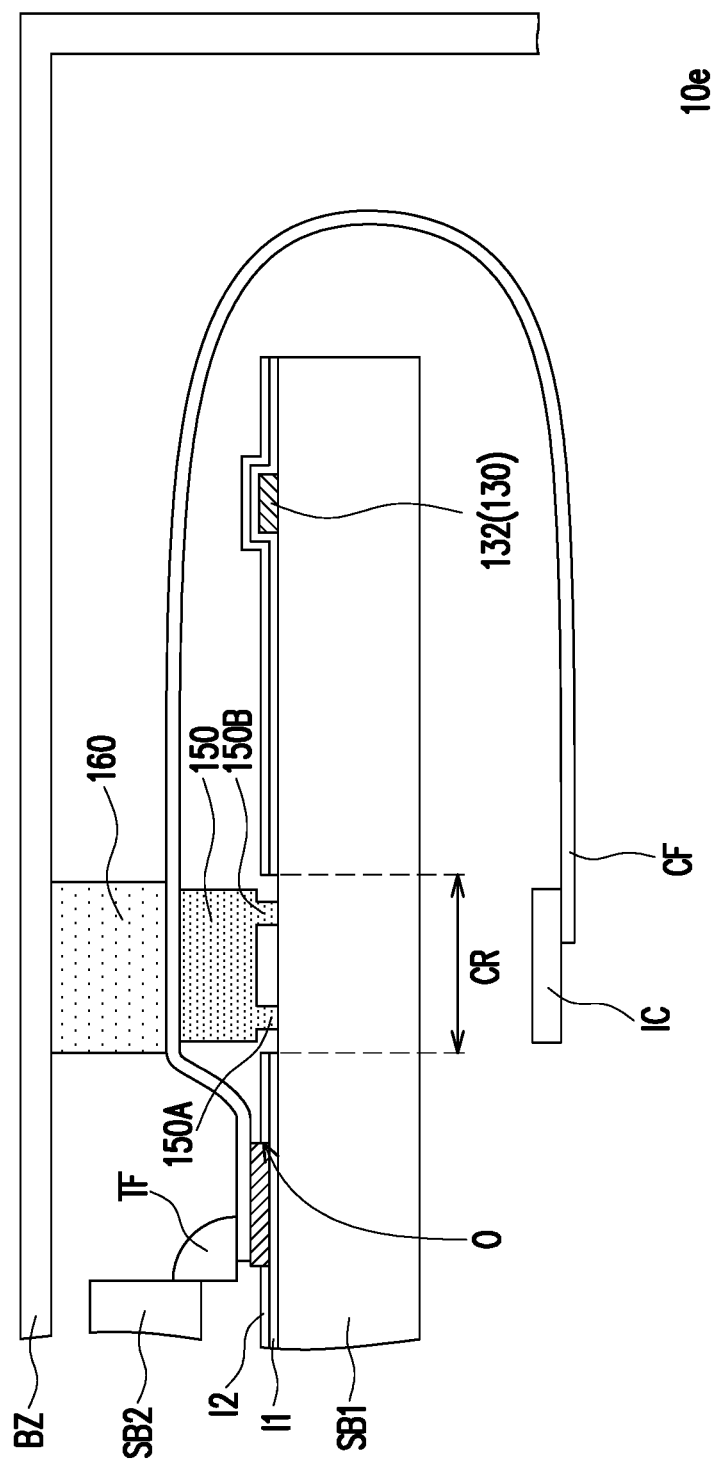
FIG. 5 is a cross section of a device substrate according to an embodiment of the invention.

FIG. 5 is a cross section of a device substrate according to an embodiment of the invention. It should be mentioned here that, the embodiment of FIG. 5 adopts the reference numerals of the embodiment of FIG. 1B and a portion of the content thereof, wherein the same or similar numerals are used to represent the same or similar devices and descriptions of the same technical content are omitted. The omitted portions are as described in the above embodiments and are not repeated herein. For ease of explanation, FIG. 5 omits some components of the device substrate.

The main difference between a device substrate 10e of FIG. 5 and the device substrate 10a of FIG. 1B is that the surface of the second barrier structure 150 of the device substrate 10e facing the cutting path CR has protruding structures 150A and 150B.

The second barrier structure 150 of the device substrate 10e is in contact with the cutting path CR via the protruding structures 150A and 150B having a smaller area. The pressure applied to the second barrier structure 150 may be concentrated at the protruding structures 150A and 150B of the second barrier structure 150 such that the second barrier structure 150 is more closely attached to the cutting path CR.

Figure 6:
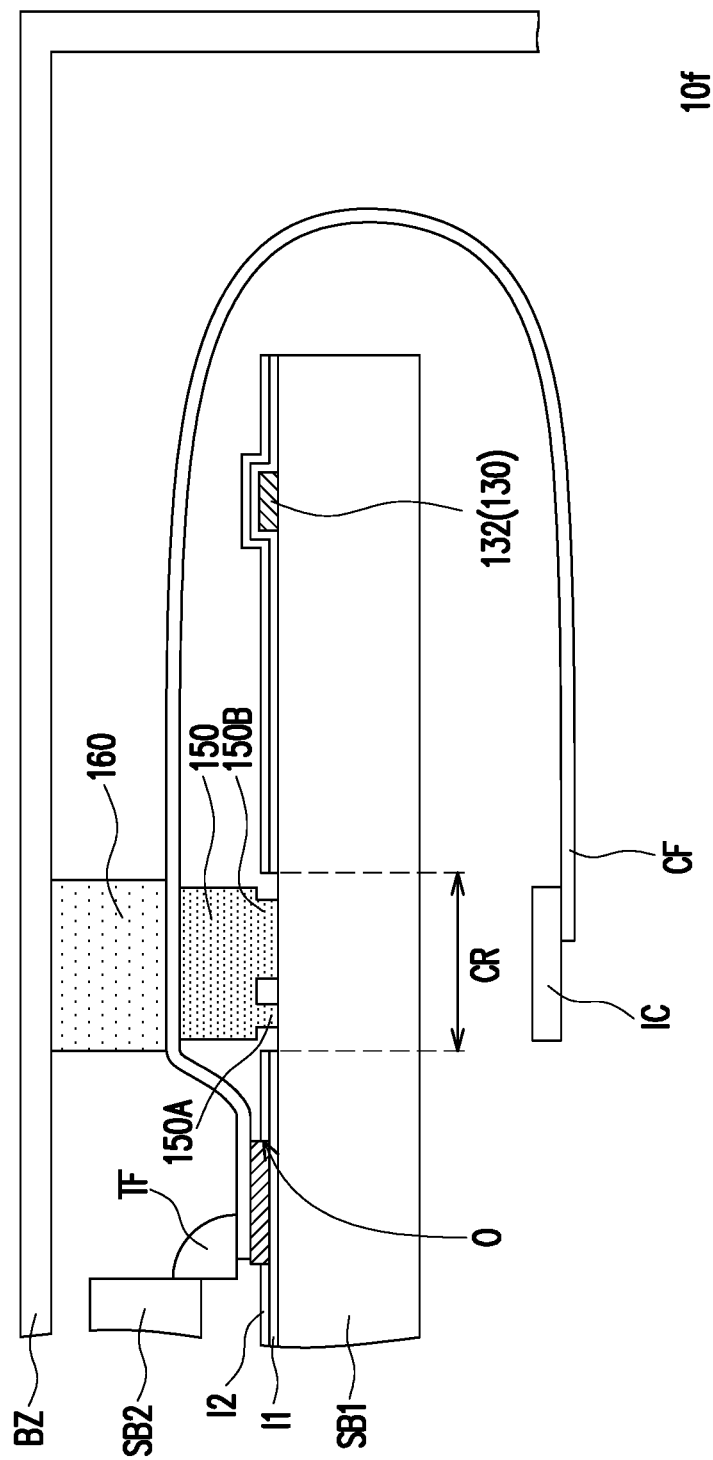
FIG. 6 is a cross section of a device substrate according to an embodiment of the invention.

FIG. 6 is a cross section of a device substrate according to an embodiment of the invention. It should be mentioned here that, the embodiment of FIG. 6 adopts the reference numerals of the embodiment of FIG. 5 and a portion of the content thereof, wherein the same or similar numerals are used to represent the same or similar devices and descriptions of the same technical content are omitted. The omitted portions are as described in the above embodiments and are not repeated herein. For ease of explanation, FIG. 6 omits some components of the device substrate.

The main difference between a device substrate 10f of FIG. 6 and the device substrate 10e of FIG. 5 is that the surface of the second barrier structure 150 of the device substrate 10f facing the cutting path CR has the protruding structures 150A and 150B having inconsistent widths. For example, the width of the protruding structure 150A is less than the width of the protruding structure 150B.

The second barrier structure 150 of the device substrate 10f is in contact with the cutting path CR via the protruding structures 150A and 150B having a smaller area. The pressure applied to the second barrier structure 150 may be concentrated at the protruding structures 150A and 150B of the second barrier structure 150 such that the second barrier structure 150 is more closely attached to the cutting path CR.

Figure 7:
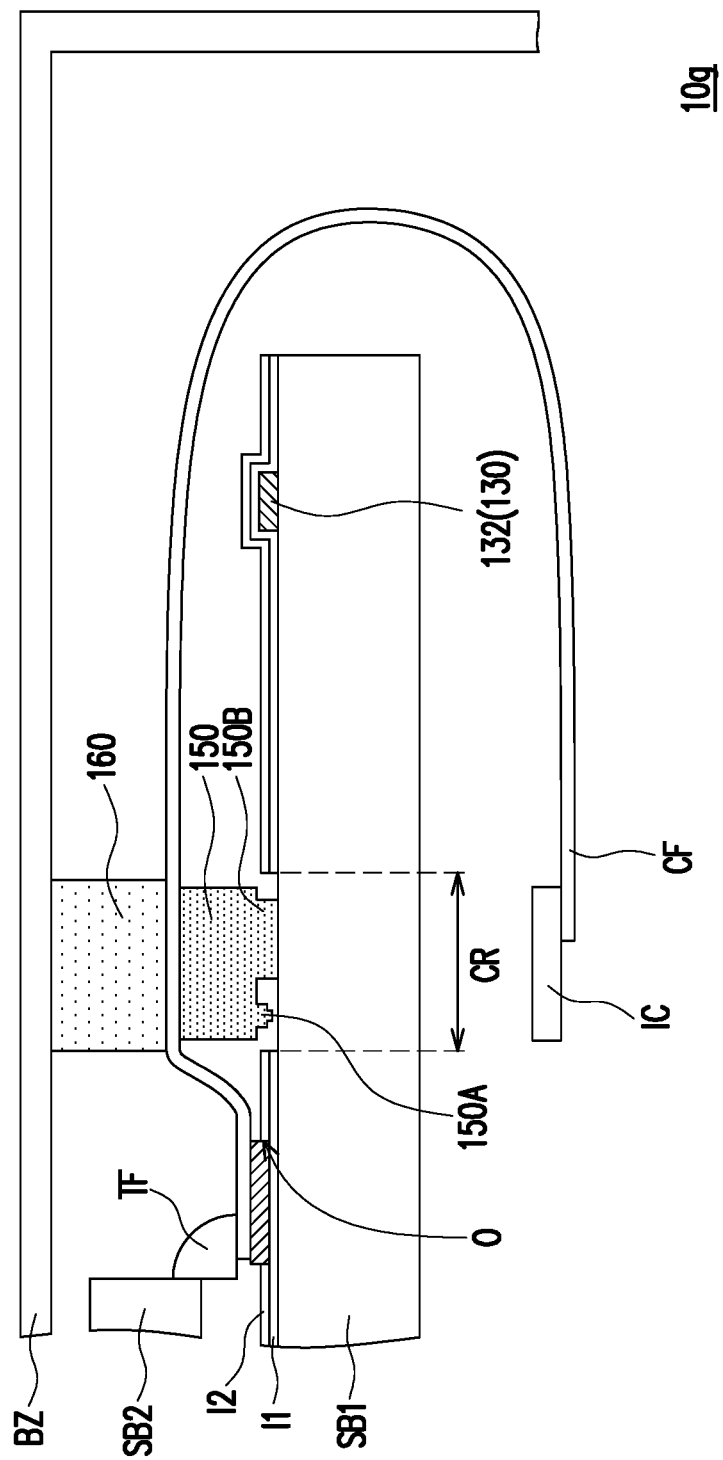
FIG. 7 is a cross section of a device substrate according to an embodiment of the invention.

FIG. 7 is a cross section of a device substrate according to an embodiment of the invention. It should be mentioned here that, the embodiment of FIG. 7 adopts the reference numerals of the embodiment of FIG. 6 and a portion of the content thereof, wherein the same or similar numerals are used to represent the same or similar devices and descriptions of the same technical content are omitted. The omitted portions are as described in the above embodiments and are not repeated herein. For ease of explanation, FIG. 7 omits some components of the device substrate.

The main difference between a device substrate 10g of FIG. 7 and the device substrate 10f of FIG. 6 is that the surface of the second barrier structure 150 of the device substrate 10g facing the cutting path CR has the protruding structures 150A and 150B having inconsistent widths, wherein the surface of the protruding structure 150A is stepped.

The second barrier structure 150 of the device substrate 10g is in contact with the cutting path CR via the protruding structures 150A and 150B having a smaller area. The pressure applied to the second barrier structure 150 may be concentrated at the protruding structures 150A and 150B of the second barrier structure 150 such that the second barrier structure 150 is more closely attached to the cutting path CR.

Figure 8:
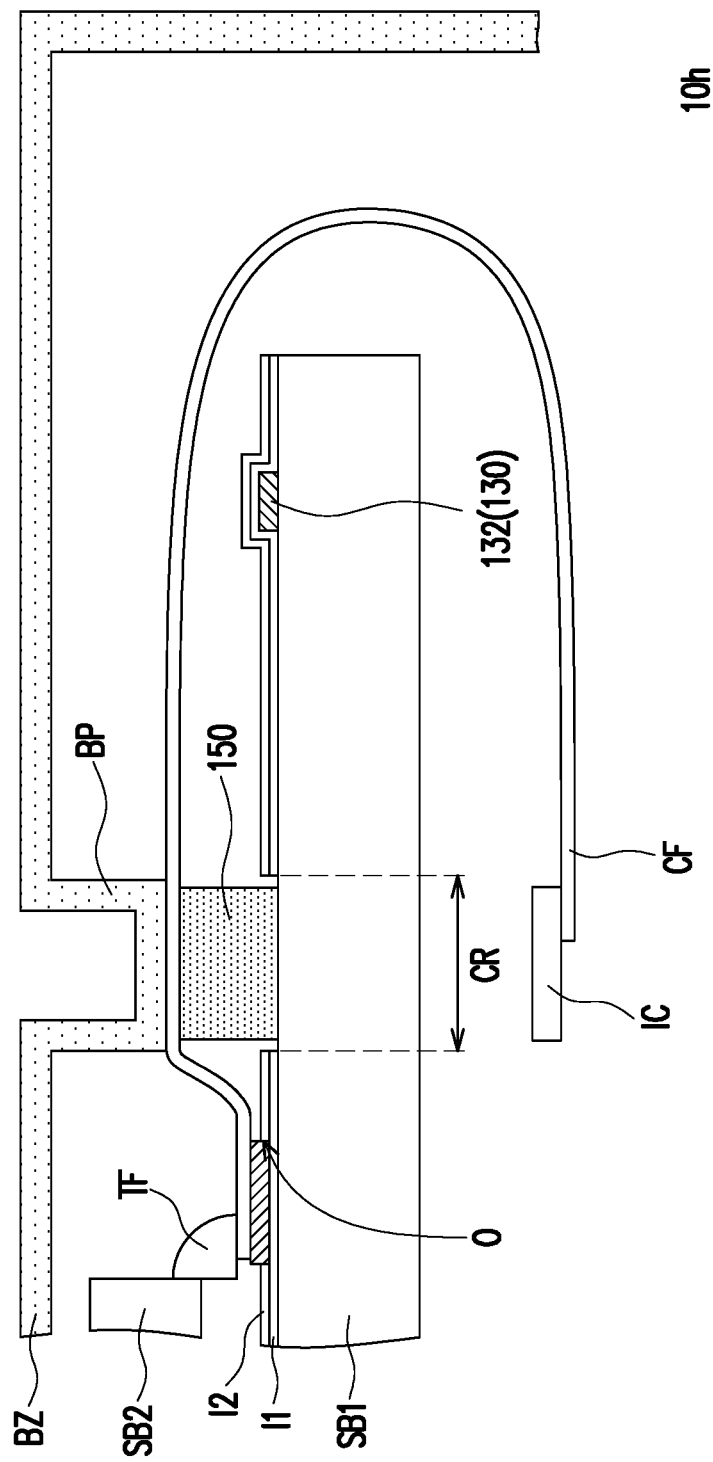
FIG. 8 is a cross section of a device substrate according to an embodiment of the invention.

FIG. 8 is a cross section of a device substrate according to an embodiment of the invention. It should be mentioned here that, the embodiment of FIG. 8 adopts the reference numerals of the embodiment of FIG. 1B and a portion of the content thereof, wherein the same or similar numerals are used to represent the same or similar devices and descriptions of the same technical content are omitted. The omitted portions are as described in the above embodiments and are not repeated herein. For ease of explanation, FIG. 8 omits some components of the device substrate.

The main difference between a device substrate 10h of FIG. 8 and the device substrate 10g of FIG. 7 is that the casing BZ of the device substrate 10h has a protruding structure BP facing the flexible circuit board CF.

The protruding structure BP is overlapped with the second barrier structure 150. In the present embodiment, the protruding structure BP helps to make the second barrier structure 150 more conformable to the cutting path CR.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A device substrate, comprising:
   a first substrate;
   an active device array located on the first substrate;
   a data line pad electrically connected to the active device array;
   a gate drive circuit test line located on the first substrate;
   a first barrier structure located on the first substrate and located between the gate drive circuit test line and the data line pad, wherein the barrier structure comprises a first blocking wall;
   a flexible circuit board located on the data line pad and electrically connected to the data line pad; and
   a protective layer located on the flexible circuit board and overlapped with the data line pad.

2. The device substrate of claim 1, wherein the first blocking wall and the gate drive circuit test line belong to a same metal layer.

3. The device substrate of claim 1, wherein the first blocking wall is connected to the gate drive circuit test line.

4. The device substrate of claim 1, further comprising:
   a first insulating layer located on the first substrate;
   a second insulating layer located on the first insulating layer;
   a third insulating layer located on the second insulating layer, wherein the first barrier structure further comprises an opening penetrating through the first insulating layer, the second insulating layer, and the third insulating layer, and the opening is located between the gate drive circuit test line and the data line pad.

5. The device substrate of claim 4, wherein the data line pad is located on the first insulating layer.

6. The device substrate of claim 1, wherein the first blocking wall is a multilayer structure and comprises a first layer and a second layer, the device substrate further comprises a first insulating layer, and the first insulating layer is located between the first layer and the second layer.

7. The device substrate of claim 6, wherein the first layer and the gate drive circuit test line belong to a first metal layer, and the second layer and the data line pad belong to a second metal layer.

8. The device substrate of claim 7, wherein the first barrier structure further comprises a second blocking wall located on the first substrate, and the second blocking wall is located between the gate drive circuit test line and the data line pad, wherein the second blocking wall belongs to the second metal layer.

9. The device substrate of claim 1, wherein the first blocking wall comprises a first layer, a second layer, and a third layer stacked together, and the device substrate further comprises a first insulating layer, a second insulating layer, and a third insulating layer, wherein the first layer is located between the first insulating layer and the first substrate, the second insulating layer is located between the first insulating layer and the second layer, and the third insulating layer is located between the second layer and the third layer.

10. The device substrate of claim 9, wherein the second layer comprises a filter material.

11. The device substrate of claim 1, further comprising:
   a shorting bar located on the first substrate and located outside the data line pad, wherein the first blocking structure is located between the gate drive circuit test line and the shorting bar.

12. The device substrate of claim 11, wherein a vertical distance between the gate drive circuit test line and the shorting bar is A, a total length of the first barrier structure is B, and 2A<B<10A.

13. The device substrate of claim 11, further comprising a second substrate located on the first substrate, wherein the first barrier structure is located between a first edge of the first substrate and a second edge of the second substrate, wherein a vertical distance between the first edge and the second edge is L, a vertical distance between the gate drive circuit test line and the shorting bar is A, and A/L is greater than or equal to 0.25%.

14. The device substrate of claim 11, wherein the first blocking wall is connected to the shorting bar.

15. A device substrate, comprising:
   a first substrate;
   an active device array located on the first substrate;
   a data line pad electrically connected to the active device array;
   a gate drive circuit test line located on the first substrate;

a first barrier structure located on the first substrate and located between the gate drive circuit test line and the data line pad, wherein the barrier structure comprises a first blocking wall;

a flexible circuit board located on the data line pad and electrically connected to the data line pad; and a second barrier structure located between the flexible circuit board and the first substrate.

16. The device substrate of claim 15, further comprising:

a casing located on the flexible circuit board; and a third barrier structure located between the flexible circuit board and the casing, wherein the third barrier structure is overlapped with the second barrier structure.

17. The device substrate of claim 15, further comprising:

a casing located on the flexible circuit board, wherein the casing has a bump structure facing the flexible circuit board, and the bump structure is overlapped with the second barrier structure.

18. The device substrate of claim 15, further comprising:

a shorting bar located on the first substrate and located outside the data line pad, wherein a cutting path is located between the data line pad and the shorting bar, and the second barrier structure is located on the cutting path.

* * * * *